US005556801A

United States Patent [19]
Hawkins et al.

[11] Patent Number: 5,556,801
[45] Date of Patent: Sep. 17, 1996

[54] METHOD OF MAKING A PLANAR CHARGE COUPLED DEVICE WITH EDGE ALIGNED IMPLANTS AND INTERCONNECTED ELECTRODES

[75] Inventors: Gilbert A. Hawkins, Mendon; Robert L. Nielsen, Pittsford, both of N.Y.

[73] Assignee: Eastman Kodak Company, Rochester, N.Y.

[21] Appl. No.: 376,699

[22] Filed: Jan. 23, 1995

[51] Int. Cl.[6] .................. H01L 21/265; H01L 21/70; H01L 27/00
[52] U.S. Cl. .................................. 437/50; 437/53
[58] Field of Search ............... 437/50, 53; 257/236, 257/237, 246, 248

[56] References Cited

U.S. PATENT DOCUMENTS

| | | | |
|---|---|---|---|
| 3,651,349 | 3/1972 | Kahng et al. | 307/304 |
| 3,700,932 | 10/1972 | Kahng | 307/304 |
| 3,789,267 | 1/1974 | Krambeck et al. | 317/235 R |
| 3,911,560 | 10/1975 | Amelio et al. | 29/578 |
| 3,927,468 | 12/1975 | Anthony et al. | 29/578 |
| 4,035,906 | 7/1977 | Tasch et al. | 29/578 |
| 4,047,215 | 9/1977 | Frye et al. | 357/24 |
| 4,055,885 | 11/1977 | Takemoto | 437/53 |
| 4,167,017 | 9/1979 | Tasch, Jr. et al. | 357/24 |
| 4,229,752 | 10/1980 | Hynecek | 357/24 |
| 4,613,402 | 9/1986 | Losee et al. | 156/643 |
| 4,742,027 | 5/1988 | Blanchard et al. | 437/53 |
| 4,746,622 | 5/1988 | Hawkins et al. | 437/26 |
| 4,789,648 | 12/1988 | Chow et al. | 437/225 |
| 4,910,569 | 3/1990 | Erhardt | 357/24 |
| 4,954,142 | 9/1990 | Carr et al. | 51/309 |
| 4,992,392 | 2/1991 | Nichols et al. | 437/53 |
| 4,994,405 | 2/1991 | Jayakar | 437/53 |
| 5,314,836 | 5/1994 | Lavine | 437/53 |
| 5,393,233 | 2/1995 | Hong et al. | 437/50 |
| 5,442,207 | 8/1995 | Jeong | 257/248 |

OTHER PUBLICATIONS

Banghart et al, Charge Transfer in the Presence of Potential Barriers, COMPEL—The International Journal for Computation and Mathematics in Electical and Electronic Eng., vol. 10, No. 4, pp. 205–213, Dec. 1991.

Primary Examiner—Mary Wilczewski
Assistant Examiner—Brian K. Dutton
Attorney, Agent, or Firm—Raymond L. Owens

[57] ABSTRACT

A method of making a fully self-aligned, planar, two phase charge coupled device comprises the steps of first forming upon a semiconductive substrate a uniform insulative layer; then implanting ions of a second conductivity type into the substrate, then patterning closely spaced strips of a first conductive layer on the insulative layer, then further implanting ions of a second conductivity type in the regions between said first conductive strips, then depositing uniformly a second conductive layer electrically isolated from the first conductive strips, then entirely removing by uniform planarization those portions of the second conductive layer disposed over regions of the first conductive strips so as to form closely spaced, coplanar, alternating first and second electrically isolated conductive strips, then electrically connecting alternate pairs of strips by a planar process of depositing and oxidizing a conductive material.

10 Claims, 13 Drawing Sheets

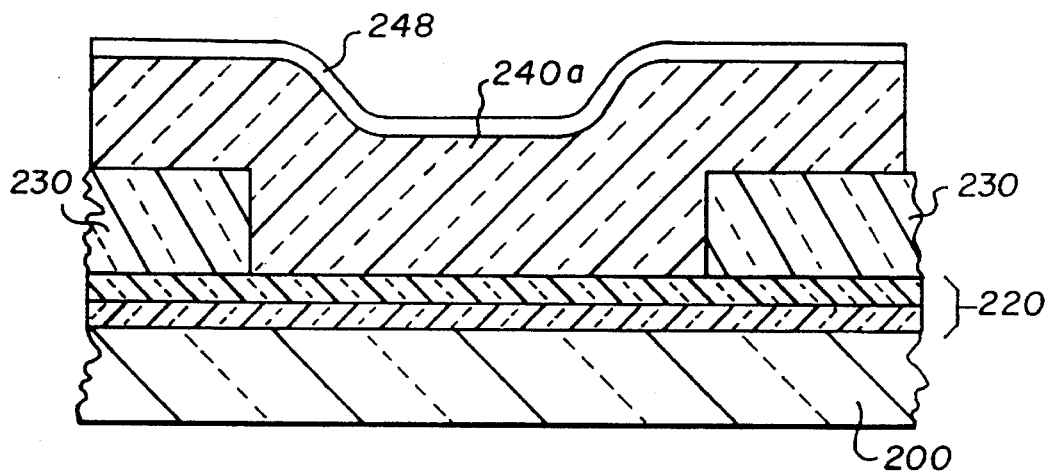
FIG. 4F
FIG. 4G
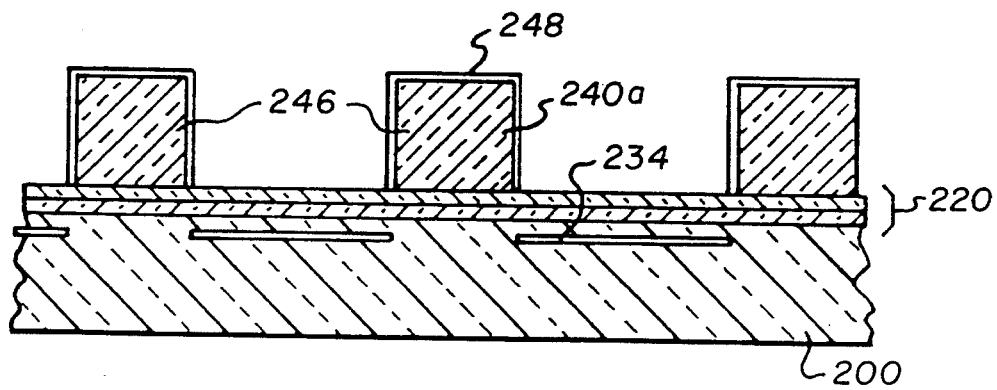

METHOD OF MAKING A PLANAR CHARGE COUPLED DEVICE WITH EDGE ALIGNED IMPLANTS AND INTERCONNECTED ELECTRODES

CROSS REFERENCE TO RELATED APPLICATION

Reference is made to commonly assigned U.S. application Ser. No. 08/376,944, filed concurrently herewith, entitled "Method of Making a Confined Planar Charge Coupled Device with Edge Aligned Implants and Interconnected Electrodes" by Hawkins et al, the disclosure of which is incorporated herein by reference.

FIELD OF THE INVENTION

This invention relates to a method of making a two phase charge coupled device in which ion implants and gate electrodes are self-aligned.

BACKGROUND OF THE INVENTION

Charge coupled devices (hereinafter also referred to as CCD's) have found wide acceptance as shift registers for transporting charge in semiconductive substrates. A series of laterally spaced gate electrodes adjacent to but conductively separated from the semiconductive substrate and from one another are relied upon to transport minority carrier charge in discrete transfer steps within the semiconductive substrate. Each charge transfer step is achieved by proper potential biasing of the gate electrodes so that charge is attracted from one charge storage region to a next adjacent charge storage region in the semiconductive substrate.

It is essential that charge transfer be complete (high charge transfer efficiency) due to the large number, typically a thousand, of charge transfers employed in device operation. It is also desirable for some devices, such as full frame devices, that as much light as possible penetrate the electrode structure in regions where photosensitivity is desired.

Three phase CCD's, such as those described in Kahng et al., U.S. Pat. No. 3,700,932, are among the simplest to construct. The potential well in the substrate is uniform under each electrode and is controlled by the potential applied to the corresponding electrode. Charge transfer efficiency in three phase CCD's can be high because the potential in the semiconductive substrate varies monotonically from its value in the region under one electrode to that under an adjacent electrode when the two electrodes are biased for charge transfer, as is well known in the art. While three phase CCD's are simple in construction, the three phase clocking required for charge transport has been regarded as disadvantageous and the art has sought to construct a CCD capable of being driven by a two phase clock, in which case the CCD must be modified in construction to directionally bias charge transfer. An early two phase CCD, such as described in Kahng et al., U.S. Pat. No. 3,651,349, relied upon an insulator of stepped thickness under a single gate electrode to accomplish this modification, the step creating a region of lesser potential depth in the semiconductive substrate where the insulator was thinner and a region of greater potential depth where the insulator was thicker. Although the charge transfer efficiency of this device was high, the non-uniformity of the insulative layer was cumbersome to construct and required portions of the gate electrodes to lie in different planes, also complicating fabrication.

The art has therefore shown a preference for two phase CCD's having a simpler insulative layer and gate electrode construction relying on regions of increased impurity dopant concentration in the semiconductive substrate for directional biasing of charge transfer, as illustrated by Krambeck, U.S. Pat. No. 3,789,267. Such CCD's are illustrated by FIG. 1 in which a semiconductive substrate 301 of a first conductivity type supports an insulative layer 303 on which interlaid sets of gate electrodes 305,306, and 307 connected to the phase 1 and phase 2 power sources as shown are positioned. As shown, regions 309, formed by ion implantation in the semiconductive substrate, exhibit a different net level of impurity doping than the surrounding portions of the semiconductive substrate. The regions can be of the first conductivity type as taught in U.S. Pat. No. 3,789,267 or can alternatively be of a second conductivity type, as taught by Tasch et al. in U.S. Pat. No. 4,035,906. It is particularly preferred that such implants be of a species such as arsenic which diffuses only slowly in the semiconductive substrate, because thermal diffusion of dopants produces potential "wells" or potential "barriers" which trap charge during transfer, as is well known in the art. It is also preferred that such implants be accomplished at the lowest possible energies to reduce lateral spread or straggle of the dopant due to scattering of energetic dopant ions from the atoms in the substrate.

While the methods taught by U.S. Pat. Nos. 3,789,267 and 4,035,906 allow the use of low energy implants and of arsenic implants in particular, the implants and the gates are located with respect to one another by benchmarks not identified and are not self-aligned, as illustrated for a typical misalignment in FIG. 1. The art has encountered difficulty constructing two phase CCD's with such impurity regions not self-aligned to the gates, because misalignment in either direction produces potential "wells" or potential "barriers" which trap charge during transfer, as is well known in the art, discussed for example by Banghart et al. in COMPEL-The International Journal for Computation and Mathematics in Electrical and Electronic Engineering, Vol. 10, No. 4, 205–213, 1991. Also, the regions of overlap of the second conductive electrode strips over the first conductive electrode strips, as has been long practiced in the art, reduce the amount of light penetrating the electrode structure and introduce process dependent variability in the amount of light passed. In addition, all the methods thus far cited suffer increased topography as practiced, due to the overlap of electrodes, generally not desirable in semiconductor processing.

Virtual phase CCD's, as taught by Frye et al. in U.S. Pat. No. 4,047,215, Nichols et al. in U.S. Pat. No. 4,992,392, and by Hynecek in U.S. Pat. No. 4,229,752, have been employed to substantially accomplish self-alignment of the potential in the semiconductive substrate due to a direction biasing implant under the clocked electrode. In this technology, one set of physical electrodes is replaced by a heavily doped region near the surface of the semiconductive substrate. Such virtual phase electrodes are used to uniformly fix or pin the surface potential in a manner self-aligned to the adjacent physical gate electrode and to negate the effect of misalignment of direction biasing implants under the physical electrode. In addition to accomplishing self-alignment of implant and electrode, this technology also allows a large fraction of incident light to pass directly into the semiconductor substrate, and the absence of a second conductive electrode improves the device topography. However, the amount of charge that can be transferred in virtual phase CCD's is limited due to the inability to clock the potential of the pinned region. Also, the process taught by U.S. Pat. No. 4,229,752 requires diffusion of the implanted dopant out of an insulative material, a process difficult to control and producing lateral spreading of implant profiles, an effect also well known in the art to itself produce "wells" and "barriers" to charge transfer. Such diffusion out of an insulative material is also required by a similar method of fabrication of two phase CCDs taught by Tasch et al. in U.S. Pat. No. 4,167,017.

Anthony et al. in U.S. Pat. No. 3,927,468, Losee et al. in U.S. Pat. No. 4,613,402, and Hawkins et al. in U.S. Pat. No. 4,746,622 disclose methods of fabricating self-aligned two phase CCD's in which the charge transfer direction biasing implants are fully self-aligned to phase 1 and phase 2 electrodes, both of which can be clocked independently. Although the implants taught are self-aligned, CCD's fabricated by these method suffer some degree of implant induced potential "wells" and potential "barriers" due to the inherent necessity in these methods of implanting at least one direction biasing implant through the gate electrode. This implantation procedure requires a higher energy implantation in comparison to implantation through the insulative layer alone or directly into the semiconductive substrate which is well known in the art to result in lateral spreading or straggle of the implant in the semiconductive substrate, such straggle in turn inducing potential "wells" and "barriers", also known in the art. Again, the regions of overlap of the electrodes reduce the amount of light penetrating the electrode structure and introduce process dependent variability in the amount of light passed as well as well as additional topography.

Amelio et al., in U.S. Pat. No. 3,911,560, teaches a method to construct self-aligned two phase CCD's in which the charge transfer direction biasing implants are fully self-aligned to electrode phases, both of which are clocked, and which does not require implantation of a charge transfer direction biasing implant to be through a gate electrode. Therefore, this method in principal avoids the occurrence of potential "wells" and "barriers" as well as enabling all phases to be clocked. Because the implants are made directly into the substrate or through only a thin dielectric layer, lateral spread of the implanted species is restricted and slowly diffusing dopants such as arsenic may be employed, additionally avoiding the occurrence of potential "wells" and "barriers". However, the fabrication steps of connecting two adjacent gate electrodes electrically to form a single gate electrode, as taught by U.S. Pat. No. 3,911,560, are cumbersome and require relatively large amounts of space The resulting structure of the device is not conducive to optical transmission, and device topography is greatly increased. It is particularly difficult to provide small devices whose storage regions alone are implanted in a self aligned manner, because the wider of the electrode strips must be deposited first, in order to accommodate the overlapping structure of the second conductive electrode strips. Thus the implant which is self-aligned occurs preferably under the second phase, or smaller of the electrode strips, and is thereby associated with the transfer region.

SUMMARY OF THE INVENTION

It is an object of this invention to provide an improved method of making a two phase CCD device.

It is a further object of this invention to provide improved optical transmission through the gate electrode structure as well as reduced device topography.

These objects are achieved in a method of making, at a region of a first conductivity type in a semiconductive substrate, a planar, self aligned, two phase CCD, the steps comprising (a) uniformly implanting, in a semiconductive substrate of the first conductivity type, impurity ions of the second conductivity type to form a buried channel region beneath the surface of the semiconductive substrate;

(b) patterning, in the form of closely spaced first conductive strips, a first conductive layer on an insulative layer uniformly overlying the semiconductive substrate;

(c) further uniformly implanting impurity ions of the second conductivity type into the semiconductive substrate, the implant blocked in regions covered by the first conductive strips;

(d) providing insulating regions over the exposed first conductive strips;

(e) uniformly depositing a second conductive layer;

(f) uniformly planarizing the entire deposited second conductive layer to remove the layer entirely from regions in which it overlaps the first conductive strips at least to the extent that the second conductive layer is patterned in electrically isolated second conductive strips as a result;

(g) etching groves in the insulative regions separating alternate pairs of polysilicon electrodes, the etched regions contiguous with portions of the first and second conductive strips on each side; and (h) filling said groves with a conductive material to electrically connect alternate pairs of conductive strips to form first and second conductive electrodes.

This method advantageously provides self-alignment of edges of charge transfer direction biasing implants to all gate electrodes without requiring implantation of impurity ions through gate electrodes.

It is a related advantage that CCD's constructed in accordance with this invention have substantially reduced charge transfer "wells" and "barriers" produced by misalignments and by lateral spread of charge transfer direction biasing implants. As a result, a method is provided for making CCD's with increased charge transfer efficiency. This method also allows for the clocking of all gate electrodes.

It is also a related advantage that CCD's constructed in accordance with this invention have transfer and storage regions of both phases which are identical and which are defined by a single mask level, thereby not depending on mask to mask alignment tolerances, well known in the art to reduce the charge capacity of CCDs.

A feature of this invention is that either the transfer or the storage electrodes may be deposited first, there being no overlapping structure of the second conductive electrode strips to contend for space over the first strips. It is a related advantage that CCD's constructed in accordance with this invention have transfer regions not subject to the need for implantation other than the initial implantation of the first conductivity type. Also, the method enables the use of charge transfer direction biasing implants of either conductivity type.

Another advantage of this method is that the process provides a simple and planar means of electrically connecting laterally adjacent gate electrodes which uses a minimum of space. Devices made in accordance with this invention exhibit enhanced planarity, which is generally acknowledged to be advantageous in semiconductor device fabrication. A related feature, advantageous in the manufacture of image sensors, is that the method provides for enhanced optical transmission of light into the substrate.

The method described is particularly suited to the construction of two phase CCD's but can also be applied equally to the fabrication of other types of CCD structures benefiting from self-alignment of electrodes and implants and from implants of low lateral spread, such as charge transfer speed-up implants well know in the art of three and four phase CCD's.

Other advantageous features will become apparent upon reference to the following "Description of the Preferred Embodiment", read in light of the attached drawings.

DESCRIPTION OF THE PREFERRED EMBODIMENTS

Figure 1:
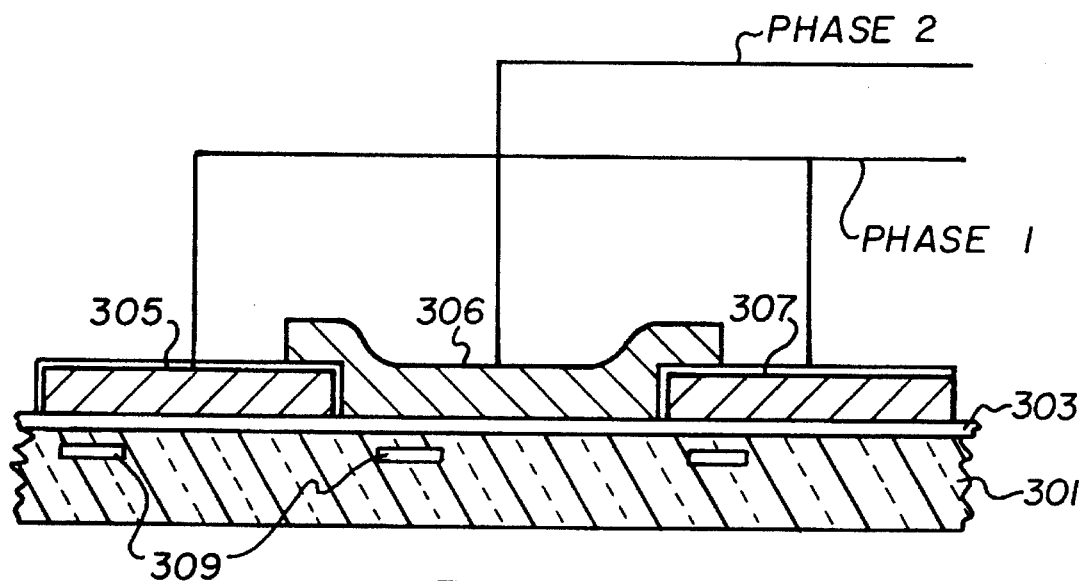
FIG. 1 is a fragmentary, partially schematic vertical section view through a semiconductor device, illustrating a prior art construction.

Much of the following discussion concerns the construction of a two-phase CCD using polysilicon electrodes. While particularly suited to this device, the present invention is in addition applicable to any device in which an implant is desired formed below and self-aligned to a conductive electrode or a portion of a conductive electrode without the necessity of implantation through the electrode or any part of the electrode. The term "self-aligned" is taken to mean that accurate alignment of two physical structures is not dependent on accurate alignment of a mask. The invention is useful in any situation where extent of the implanted dopant under one or more clocked phases is determined by a single mask and is not dependent on mask to mask alignment. The term polysilicon is used to mean a conductive electrode material formed from polysilicon which may be heavily doped either during or after deposition to enhance its conductivity by impurity ions such as phosphorous, arsenic, or boron.

The method of the present invention for constructing two phase CCD's exhibiting accurate alignment of implanted dopants and conductive electrodes is illustrated by reference to FIGS. 2A through 2I. A semiconductive substrate 10, most preferably P type single crystal silicon, having a buried n-type channel (not shown) to contain minority carrier charge (electrons), has overall a first insulative layer 14, preferable a grown layer of silicon dioxide (oxide), and a second insulative layer 16, preferably of deposited silicon nitride (nitride), the insulating layers together comprising a bilayer dielectric 20. Preferably, the thickness of bilayer dielectric 20 is in the range 100 to 1000 Angstrom units, the thickness of the oxide being greater than that of the nitride as is known in the state of the art of dielectric insulators. Deposited on bilayer dielectric 20 is a first conductive layer 30, preferably polysilicon, whose properties are such that nearly vertical walls can be formed by dry etching, the pattern being defined by conventional photoresist (not shown), and having a thickness sufficient to block ion implants otherwise directed into the silicon substrate, and also at least as thick as the desired thickness of the conductive electrodes later to be formed. Such thicknesses preferable lie in the range of from several tenths of a micron to several microns, the thicker values appropriate for blocking very high energy implants, for example implants in the range of from 200 KeV to 2 MeV. It is also desired that the layer be capable of forming an electrically insulative region on its surface upon oxidation.

Figure 2A:
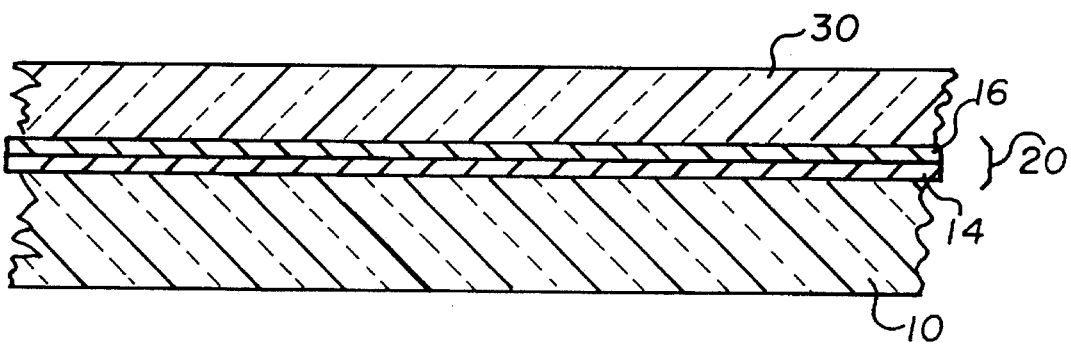
FIGS. 2A through 2I are partially schematic vertical section views through a semiconductor device illustrating respectively the successive steps of one preferred embodiment of this invention.
Figure 2B:
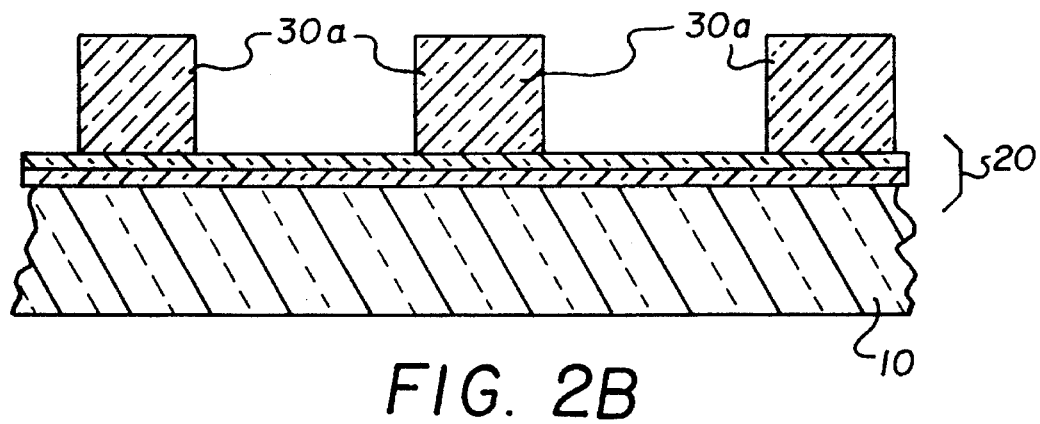

FIG. 2B shows the structure of FIG. 2A after definition of first conductive layer 30 to form closely spaced conductive strips 30a by dry etching, for example, by anisotropic reactive ion etching, know in the art to form vertical sidewalls. The photoresist has been removed in FIG. 2B. The walls of the resulting conductive strips will be utilized in accordance with this invention to define the edges of the charge transfer direction biasing implants and to define the location of the sides of the subsequently formed second conductive strips, as will be described. The ability to make this wall vertical is thus a key feature in the present invention.

Figure 2C:
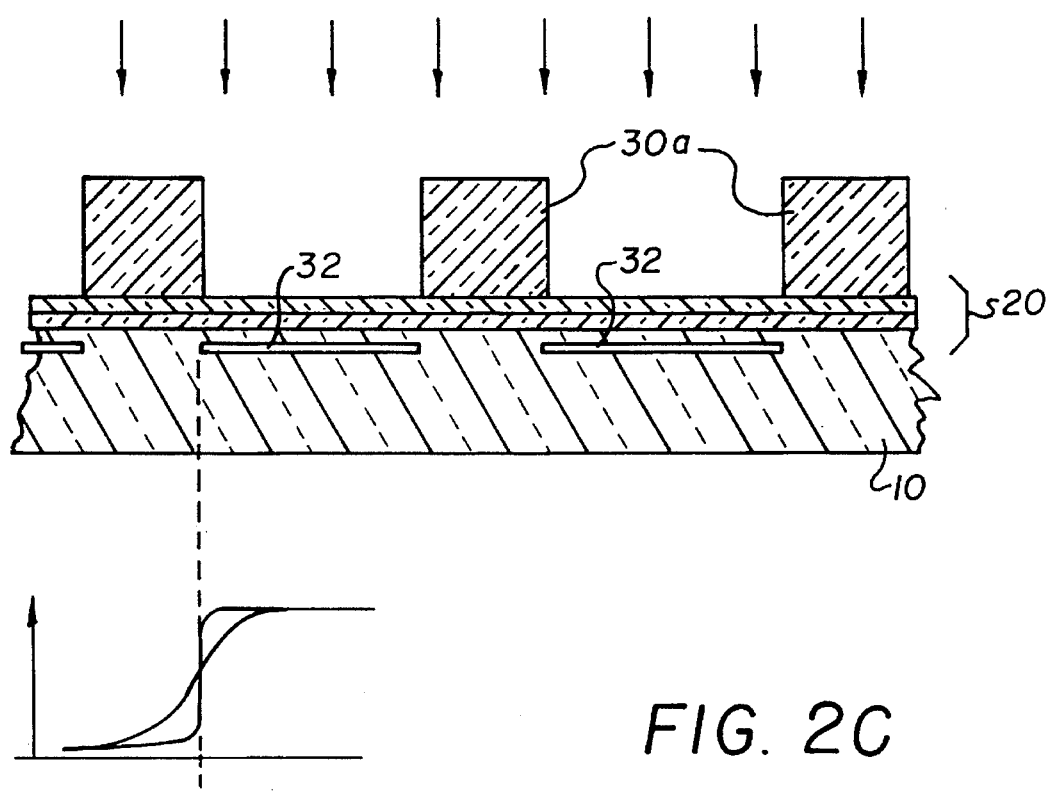

FIG. 2C shows one preferred embodiment in which an implant (arrows) of the second conductivity type, preferably Arsenic, is used to form the storage region of the first CCD phase. The location of the As implant 32 is shown in FIG. 2C. The spreading of the implant laterally in accordance with this invention is small in comparison to the prior art taught in accordance with U.S. Pat. Nos. 3,927,468; 4,613, 402; and 4,746,622, because the energy required to penetrate the bilayer dielectric 20 is much less than that required to penetrate the conductive electrodes and the dielectric layers taught in the patents referred to above. This is shown schematically by the implant profile graph under FIG. 2C, which depicts the implant concentration (vertical axis) as a function of position near the electrode edge for prior art technologies (spread-out curve) taught in accordance with U.S. Pat. Nos. 3,927,468; 4,613,402; and 4,746,622, and for the current invention (abrupt curve).

Figure 2D:
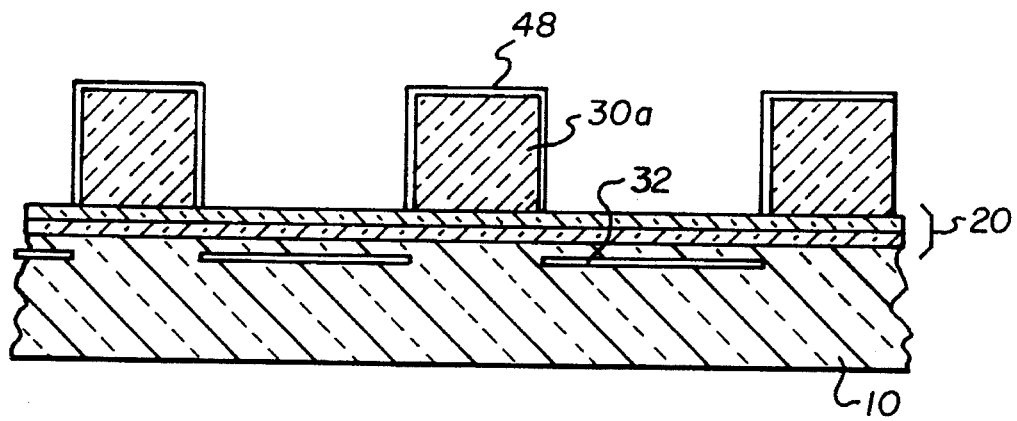

At this stage, of the two charge transfer direction biasing implants (Phase I and Phase II) have been formed. FIG. 2D shows the device cross-section following formation of insulative region 48, preferably grown silicon dioxide. In one preferred embodiment, this insulative region is grown at low temperatures to ensure minimal dopant diffusion. In the case of the preferred bias implant being arsenic, diffusion is essentially negligible for temperatures below 900 C. The oxide is grown thin, typically in the range of from 200 to 1000 Angstroms, so that the first conductive strips will be closely spaced to second conductive strips to be formed. It is advantageous that the grown oxide extends into and out of the edges of the first conductive strips in similar thicknesses, maintaining thereby a central location of the edge of the implant in substrate 10 with respect to the center of the insulative region 48. It is also advantageous that the thickness of this oxide can be adjusted and the order of its growth with respect to ion implantation altered in order to precisely establish the placement of the implant with respect to the edges of the first conductive strips.

Figure 2E:
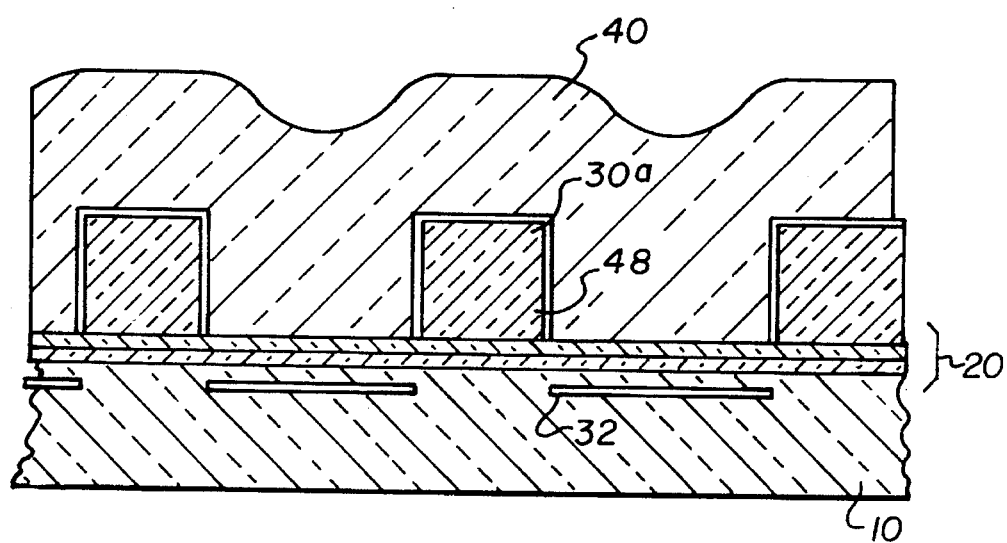

Formation of second conductive strips is next accomplished in a preferred embodiment shown in FIG. 2E, in which a second conductive layer 40 preferably heavily doped polysilicon, has been deposited, preferably by chemical vapor deposition, as is common in the art. The thickness of this layer is chosen advantageously to be about the same thickness as the first conductive layer. The preferred range of polysilicon thickness is typically from 0.1 micron to 1.0 micron for the preferred case of arsenic implantation. However, in some applications of the present invention, a later need to block more penetrating ion implantations, used for example to establish photodiodes along side the CCD shift registers, may dictate the use of thicker conductive layers.

Figure 2F:
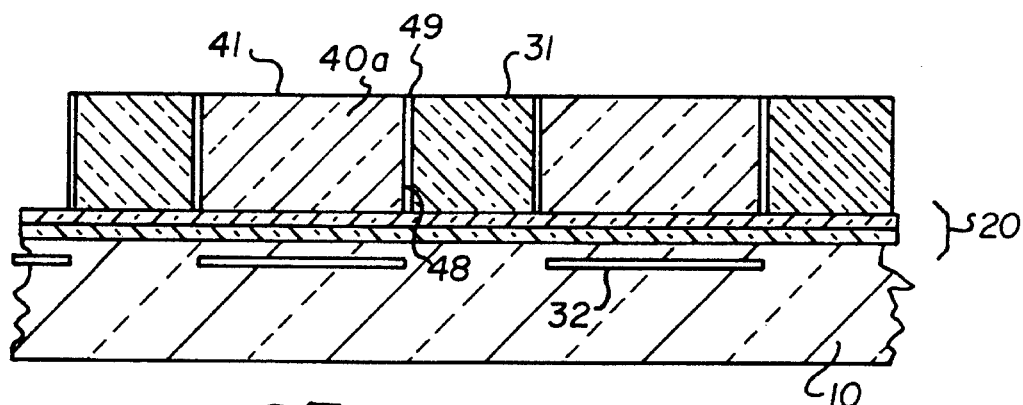

It now remains to pattern second conductive layer 40 into second conductive strips 40a in order to establish closely spaced, electrically isolated first and second conductive strips, 30a and 40a respectively. This is advantageously accomplished in one preferred embodiment by subjecting the surface of the wafer of FIG. 2E to chemical mechanical polishing (CMP), as currently practiced in the semiconductor art for the planarization of metals and dielectrics and as taught in numerous U.S. Patents such as that by Chow et al., U.S. Pat. No. 4,789,648, and by Carr et al., U.S. Pat. No. 4,954,142. This procedure, while being only one of many possible planarizing procedures, is advantageous in its ability to render the surface extraordinarily smooth, improving the ability to subsequently grow insulative oxide layers on the top regions of the first and second conductive strips. It is advantageous to planarize this layer so as to remove it entirely from regions over the first conductive electrode strips, thereby defining electrically isolated second conductive strips. The slurry for this procedure is preferably fumed silica in KOH at a Ph of about 10, so that the removal rate of polysilicon is about the same as that of oxide in order that the final polished surface comprises conductive strips of rectangular cross sections with nearly flat upper surfaces, as shown in FIG. 2F. Many other slurries are possible as practiced currently in the industry, such as slurries with larger chemical etch rates for polysilicon than for oxide, thus enabling etch stops (not shown) to be incorporated into the process to provide endpoint control. A critical feature of the current invention is preservation of the integrity of the gate dielectric directly underneath the conductive electrode during chemical mechanical polishing, a feature not generally required or obtained in the CCD art. The results of chemical mechanical polishing are shown in FIG. 2F. The surfaces 31 and 41 of first conductive electrode strips 30a and of second conductive electrode strips 40a and of the surfaces 49 of insulative region 48 are preferably coplanar to within 100 Angstroms, although the process is tolerant of lesser coplanarity.

Figure 2G:
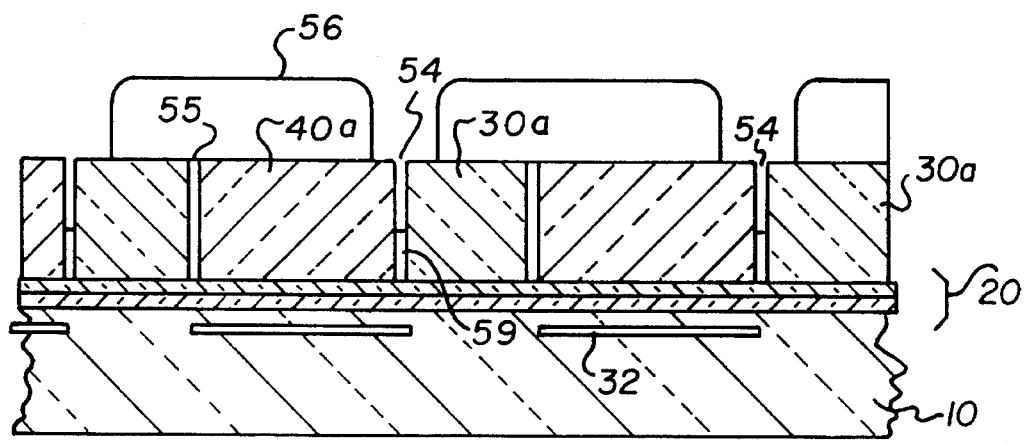

At this stage of the process the conductive electrode strips are electrically isolated. It is now desired to connect strips pairwise to form composite conductive electrodes, each of which is comprised of a first conductive strip 30a and a second conductive strip 40a, the charge transfer direction biasing implant lying under only the second conductive strip of the composite electrode. This is preferably accomplished, as shown in FIG. 2G, by first etching regions 54 of insulative regions 48 with a dry oxide etch, using conventional photoresist 56 to protect alternate regions 55 of insulative regions 48 from etching, the extent of the etch depth being about half the thickness of the coplanar first and second conductive strips, thus providing alternate pairs of conductive strips with gaps 59 having vertical surfaces of first and second conductive electrode strips closely juxtaposed with no interposing insulative layer.

Figure 2H:
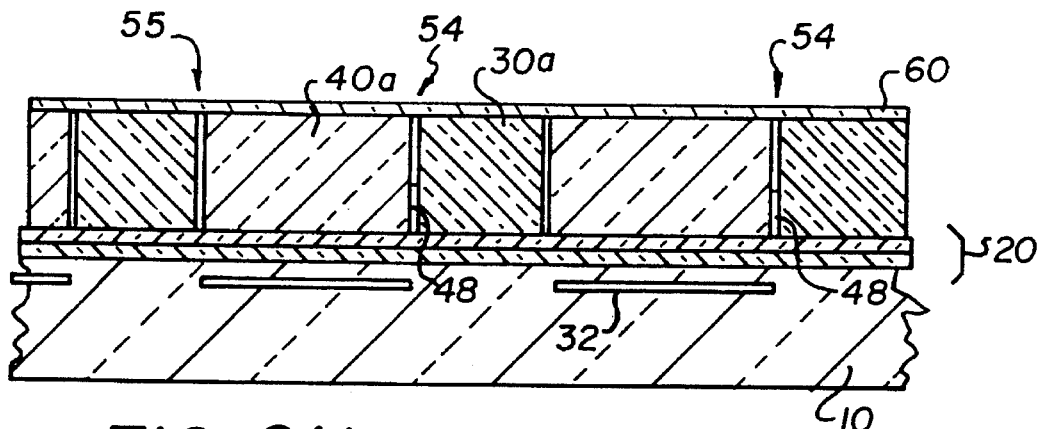

A uniform, conformal layer of a conductive interconnect region material 60, preferably doped polysilicon, is now deposited over the entire device, as shown in FIG. 2H the thickness of which is only slightly greater than half the thickness of the gaps 59 separating the electrode strips, preferably a thickness in the range of from 100 to 1000 Angstroms. In this embodiment, said deposited interconnect layer conformally fills the gaps 59 between alternate adjacent electrodes produced by the etch of the insulative regions 48 disposed between alternate first and second conductive electrode strips 30a and 40a, respectively. It is a feature of this embodiment of the current invention that deposition of the conformal interconnect layer planarizes the device structure, as is well known in the semiconductor process art. Conductive interconnect material 60 may also be undoped polysilicon, the doping being provided by diffusion from conductive strips 30a and 40a during subsequent thermal processing. Conductive interconnect material 60 may also be tungsten or tungsten silicide.

Figure 2I:
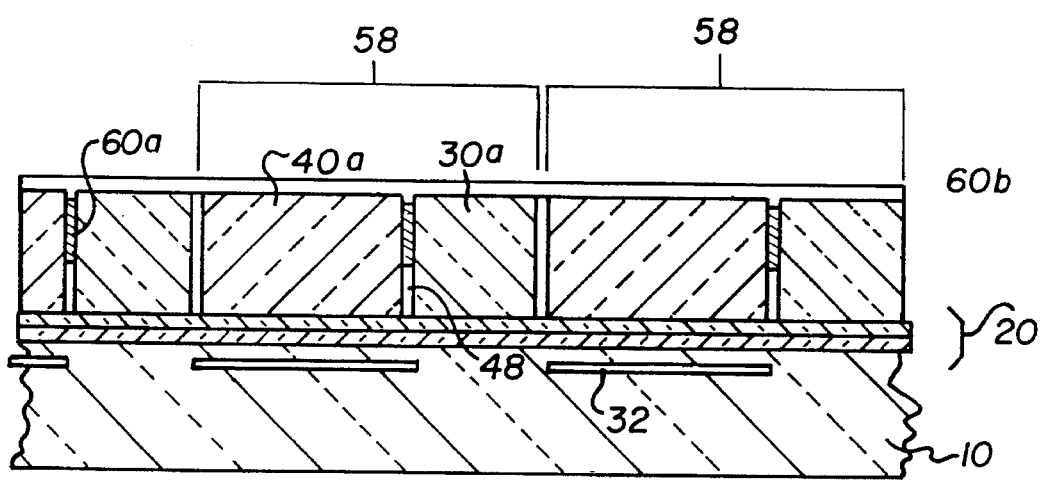

Because all conductive strips are now electrically connected due to the presence of interconnect material 60, it is necessary to segment this material in the regions 55 where no etching of insulative region 48 occurred. In the preferred embodiment, the conductive interconnect material being polysilicon, this is achieved by uniform oxidation of the conductive interconnect material, converting it from conductive polysilicon to an oxide insulator to a depth slightly greater than the thickness of the interconnect layer but less than the depth to which the gap region 59 between adjacent electrodes was etched. The results of this procedure are shown in FIG. 2I, which depicts those regions 60b of the conductive interconnect material 60 converted to oxide and those regions 60a which remain unconverted. Due to the presence of the unconverted polysilicon between alternate adjacent electrode pairs, alternate pairs of electrode strips are thereby electrically connected to form planar composite electrodes 58 for both CCD clocked phases, each such phase so formed being electrically isolated from all other phases. In another preferred embodiment, conductive interconnect material 60 is removed by planarization, preferably by using chemical mechanical polishing, except within gaps 59. In this embodiment, conductive interconnect material is removed entirely from the surfaces 31, 41, and 49 of the first and second conductive strips and insulative regions respectively, and the device surface is rendered fully planar.

In a second preferred embodiment, segmentation of the conductive interconnect material 60 may be accomplished with standard photolithography and etching, preferably dry etching, of interconnect layer 60 between alternate planar strips in regions 55. In another preferred embodiment, a top insulative material, preferably oxide, grown thermally or deposited, is provided on surfaces 31 and 41 of the first conductive electrode strips 30a and second conductive electrode strips 40a and on surfaces 49 of insulative region 48 of FIG. 2F. Conventional lithography and etching are then used to provide openings in the top insulative material in alternate regions between conductive strips, such as regions 54, after which conductive interconnect material 60 is deposited and patterned by etching to remove portions in regions where the top insulative material was not removed.

At this point the device is substantially complete, save for conventional passivation, contact openings, and conductive metal electrode deposition and patterning steps, which are unrelated and not specific to the scope of this invention, but which need be performed to complete the device in the same manner as in the completion of any two phase CCD.

It is to be appreciated that while the preferred embodiment has been described, there are many variants of the method of this invention applicable to a variety of device materials which may be employed within the scope of this invention to optimize device functionality in specific applications.

The material comprising the insulative region 48 while preferably a grown oxide may also be a deposited material, for example a nitride or a deposited oxide, or a bilayer of oxide and nitride, which reduces thermal processing.

The materials comprising the first conductive layer 30 and second conductive layer 40 while preferably doped polysilicon can in some applications be advantageously chosen to be a transparent conductor, such as indium tin oxide or tin oxide, known in the art to provide better transmission of light to the substrate, as is appropriate when the CCD is photoactive, as in the case of a full frame image sensor.

Figure 3A:
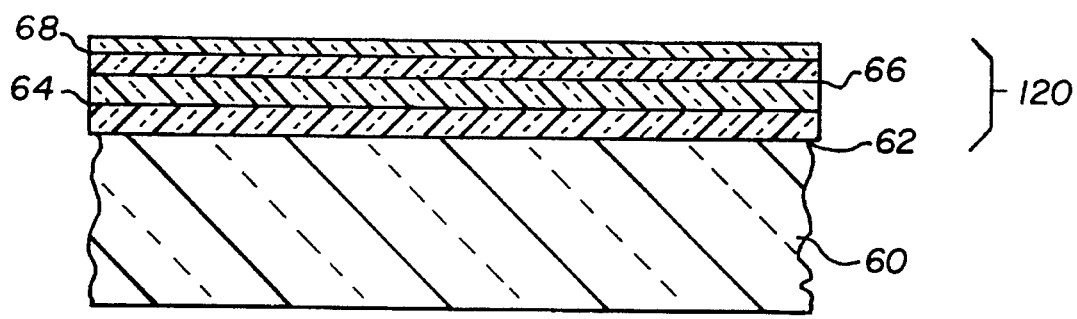
FIG. 3A is a vertical section view through a semiconductor device illustrating another aspect of this invention.

Bilayer dielectric 20 in FIG. 2A may also be comprised of other dielectric layers. FIG. 3A depicts a more complex dielectric layer 120 comprised of a 4 layer stack of oxide layer 62, nitride layer 64, oxide layer 66, and nitride layer 68, chosen to reduce the effects of charge injection from the conductive electrodes into the dielectric layers as is known in the art. Preferred in this embodiment are layer thicknesses for each of the bottom three layers of from 50 to 300 Angstroms each and less than 200 angstroms for the top layer, the bottom layer having been thermally grown, the upper layers having been deposited by standard techniques of chemical vapor deposition.

A related material choice for dielectric layer 120 is a 3 layer stack of oxide, nitride, and oxide. Preferred in this embodiment are layer thicknesses for each of the three layers of from 50 to 300 Angstroms each, the bottom layer having been thermally grown, the middle and top layers having been deposited by standard techniques of chemical vapor deposition. Another preferred choice for the dielectric layer 120 is thermally grown oxide, preferably in the thickness range 100 to 1000 Angstroms.

Figure 4A:
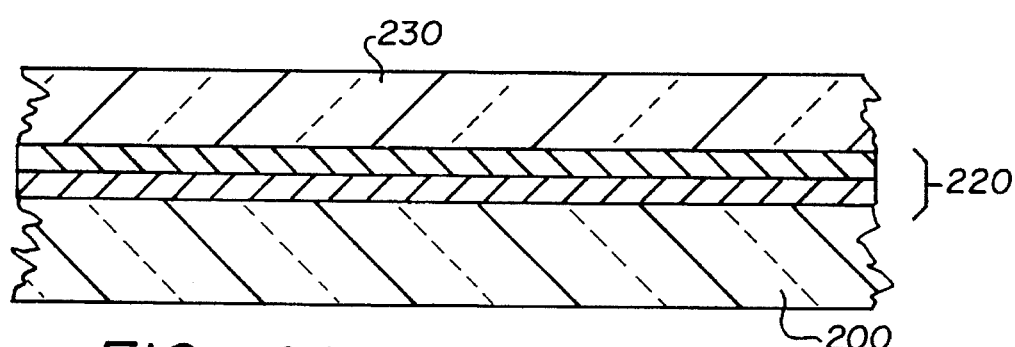
FIGS. 4A through 4N, similar to FIGS. 2A through 2I, are partially schematic vertical and plan section views of a semiconductor device illustrating the successive steps of a second preferred embodiment of this invention.
Figure 4B:
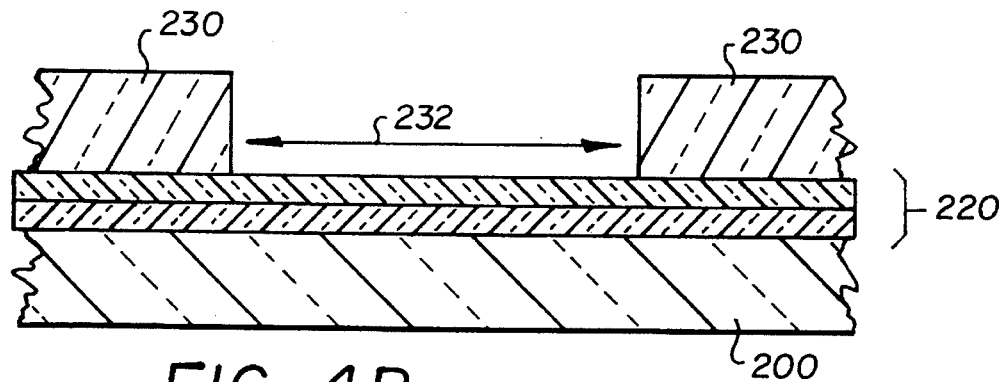

While the preferred embodiment has been described in cross-section along the direction of charge transfer of a two phase CCD shift register, the method in accordance with this invention may be advantageously applied to patterning the CCD in a direction substantially perpendicular to the direction of charge transfer as well. Such patterning is particularly useful, for example, in defining the CCD shift registers of interline transfer CCDs, in which case space must be allowed between shift registers for independent photoreceptors, as is well known in the art. The preferred embodiment of the method of fabricating such structures is shown in FIG. 4A to 4N. FIG. 4A depicts a cross-section of the CCD in a plane perpendicular to charge transfer showing a sacrificial layer 230, preferably an insulator, deposited on dielectric layer 220, on semiconductive substrate 200, the dielectric layer being similar in function and composition to the bilayer dielectric 20 of FIG. 2A or dielectric layer 120 of FIG. 3A. The sacrificial layer 230 is preferably silicon dioxide of thickness about equal to the final desired thickness of the conductive electrodes of the CCD, for example, from 0.1 to 1.0 micron. Dielectric layer 220 is preferably a bilayer of thermally grown oxide (bottom) and deposited nitride (top), the thicknesses of each lying in the range of from 50 to 1000 Angstroms. In FIG. 4B, sacrificial layer 230 has been patterned, for example by conventional photolithography techniques followed by dry etching, so that a region has been removed to form a trench 232, along which will be formed the CCD.

Figure 4C:
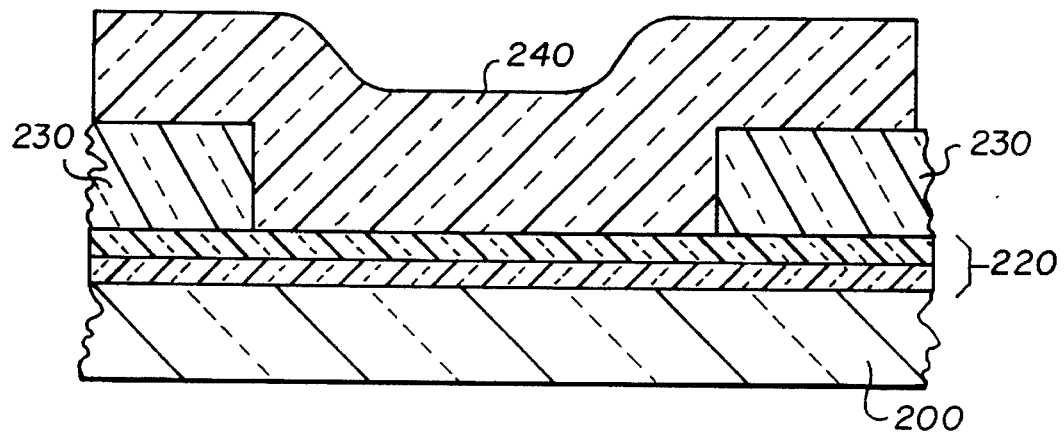

The first conductive layer 240, preferable doped polysilicon of thickness of from about 0.1 to 1.0 microns, is deposited uniformly over the sacrificial layer 230 and in trench 232, as shown in FIG. 4C. At this stage, the cross-section of the device in the center of the trench in a plane along the direction of the trench (in the direction of charge transfer) is essentially the same as the cross-sections of FIGS. 2A through 2I, as are the steps of fabrication. Therefore, in the current preferred embodiment, primarily the cross-section whose plane is perpendicular to the direction of charge flow is shown, in order to clarify the manner in which the width of the CCD is defined.

Figure 4D:
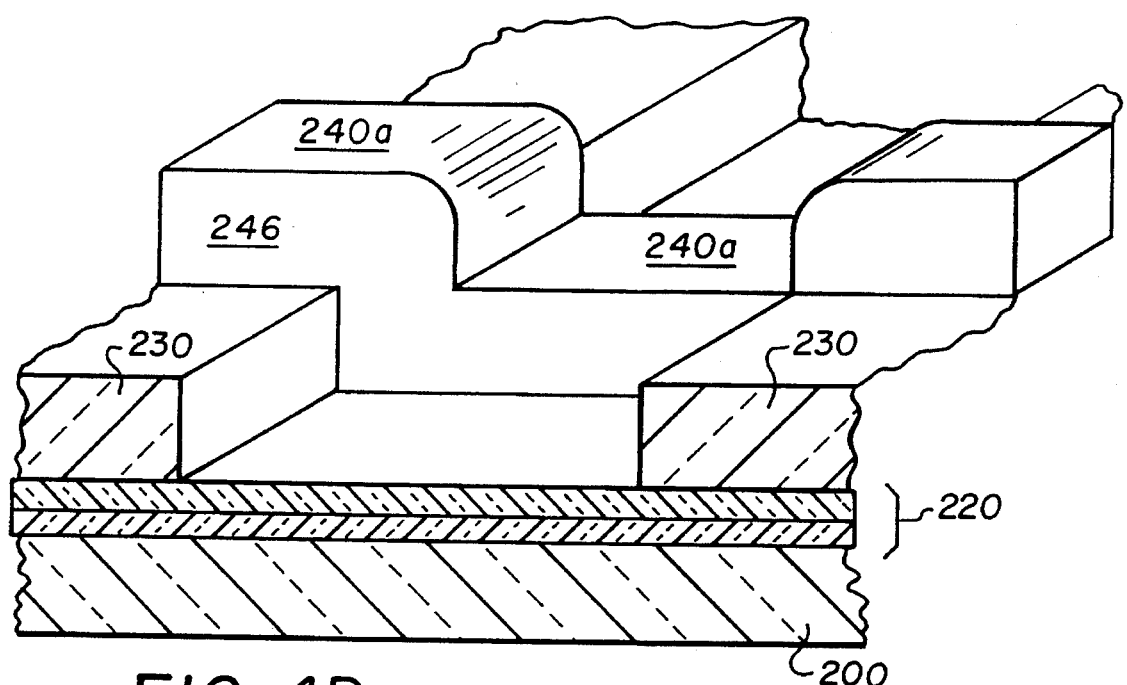
Figure 4E:
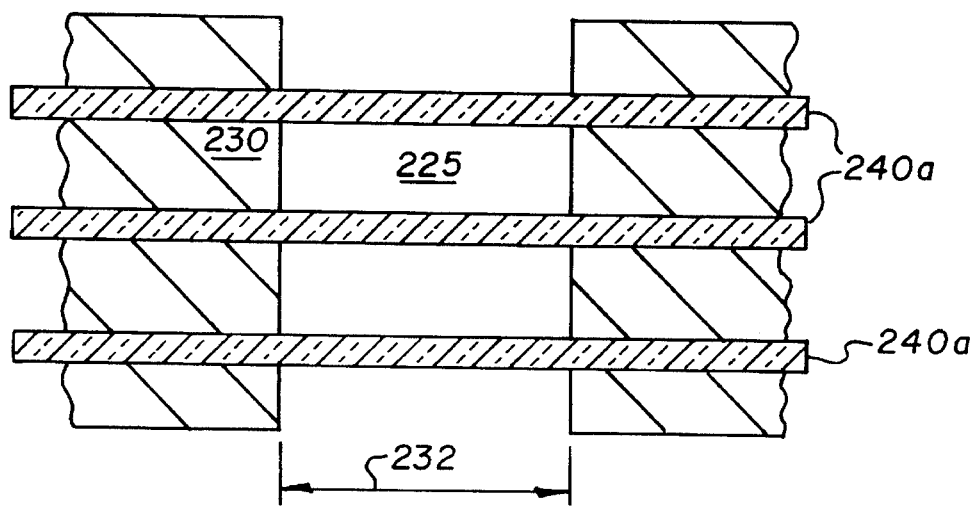

The first conductive layer 240 is now patterned, for example by conventional lithography followed by dry etching, to form closely spaced first conductive strips 240a, with vertical walls 246, substantially perpendicular to the trench 232, as depicted in FIG. 4D and 4E, each strip flowing down into and up out of trench 232. Although conventional lithography may be used to form such strips, it may also be advantageous, as is well known in the art, to first planarize the device topography, using for example spin-on-glass or multilevel photoresist, and to then perform lithography and dry etching in order to ensure that the sidewalls of the etched first electrode material are vertical and lie in a plane even near the trench edges.

The process sequence now continues identically to that described in association with FIG. 2C with implantation of impurities 234 of a second conductivity type into regions 225 (FIG. 4E) of the semiconductive substrate 200 in between first conductive strips 240a, the implant being blocked by the first conductive strips 240a or the sacrificial layer 230 or both.

Figure 4H:
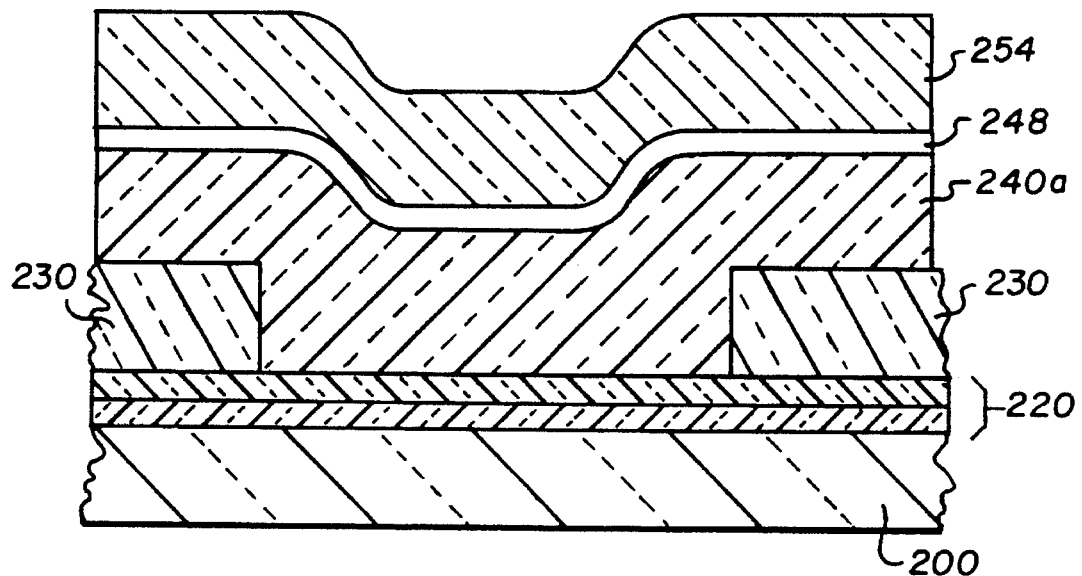
Figure 4I:
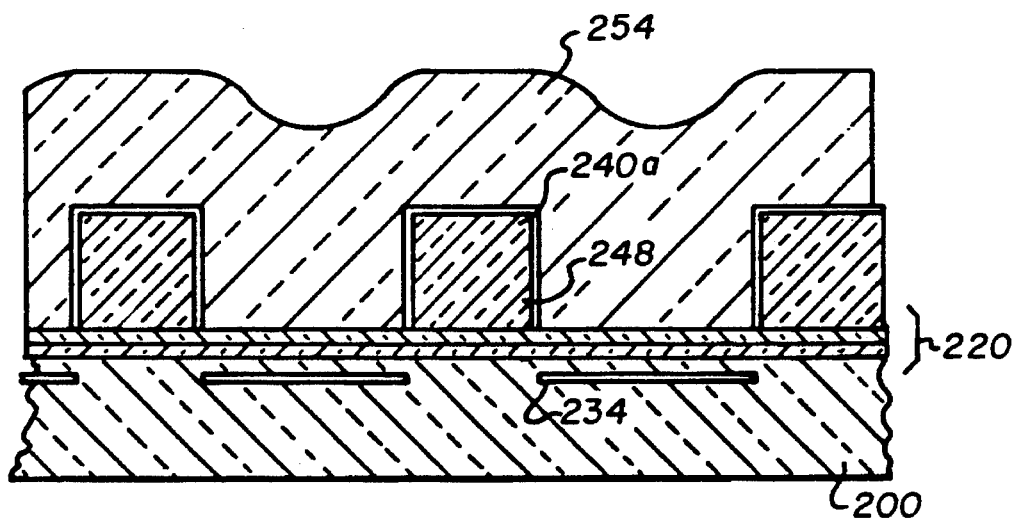

It is now desired to form an insulative region 248 over the first conductive strips 240a, and this is shown in FIGS. 4F and 4G, which depict respectively the AA and BB cross-sections of plan view FIG. 4E. Insulative region 248 is preferably formed by thermal oxidation of the preferred material, polysilicon for first conductive layer 240, and corresponds to insulative region 48 of FIG. 2D discussed in the first embodiment. Next, a second conductive layer 254, again preferably doped polysilicon, is deposited uniformly as shown in FIGS. 4H and 4I, which depict respectively regions through and in between the first conductive strips 240a in cross-section AA and BB of FIG. 4E, similar in view to FIGS. 4F and 4G.

Figure 4J:
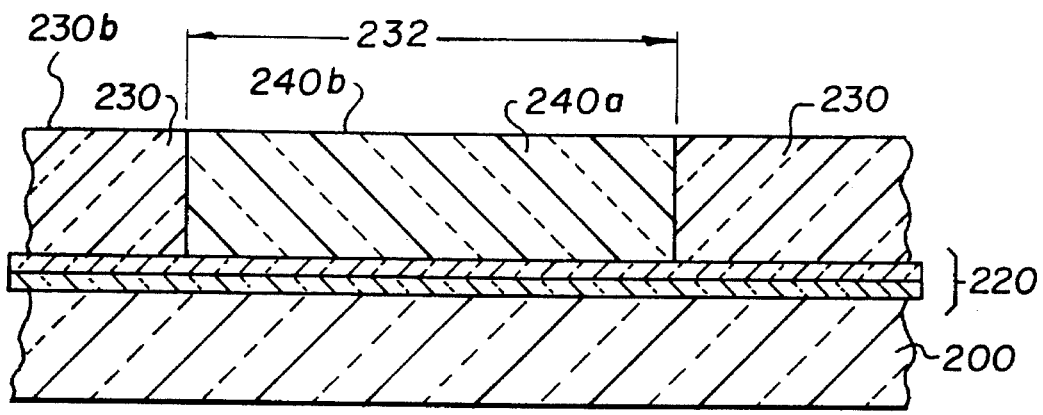
Figure 4K:
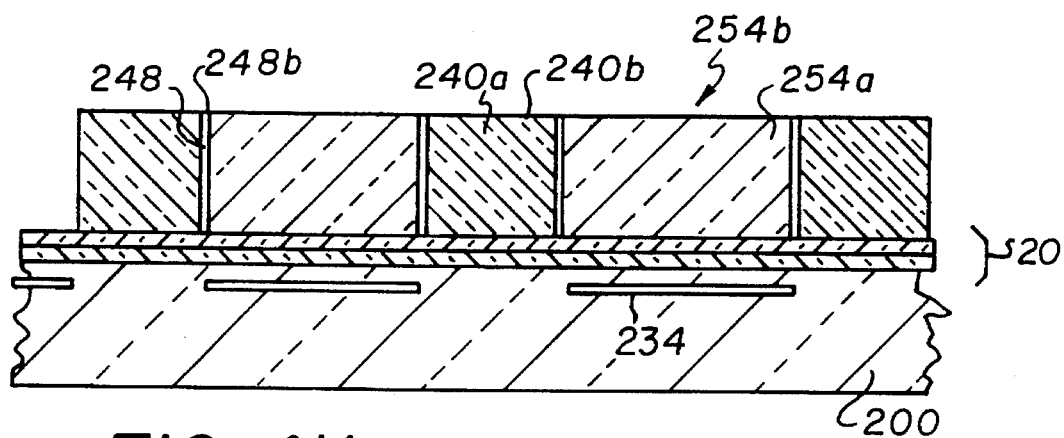
Figure 4L:
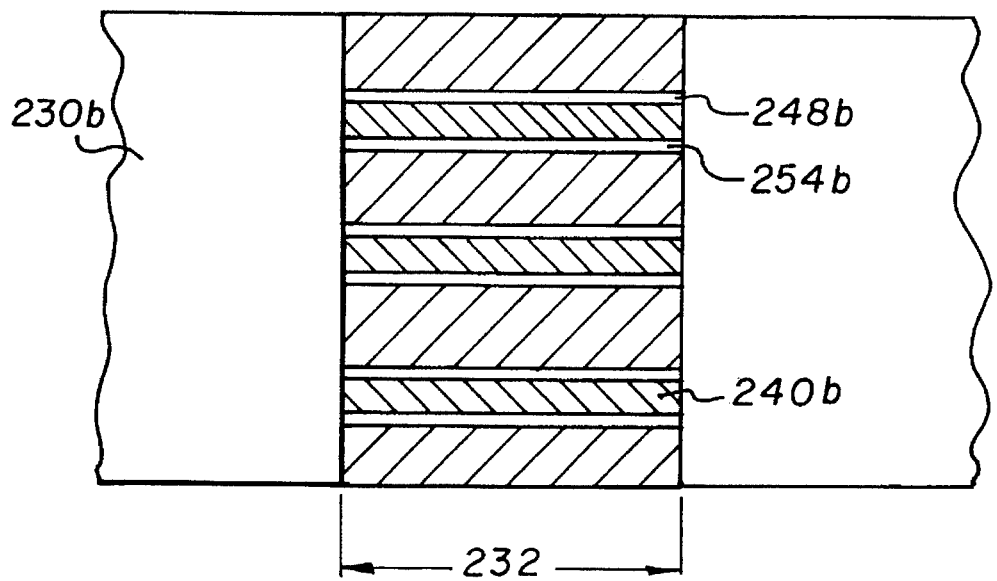

In accordance with this invention, the first conductive strips 240a and the second conductive layer 254 are simultaneously patterned in directions both perpendicular to and along the CCD by planarization, preferably by chemical mechanical polishing, performed at least to the extent that both first conductive electrode strips 240a and second conductive electrode layer 254 are entirely removed from the sacrificial layer 230, and that second conductive layer 254 is removed entirely from the first conductive strips 240a, thereby forming second conductive strips 254a, the structure shown in FIG. 4J and FIG. 4K, similar in view to FIGS. 4F and 4G. Electrically isolated, alternate conductive electrode strips 240a and 254a, lying within trench 232, are shown in cross-section in FIG. 4K. FIG. 4L shows a plan view of the structure at this stage of fabrication. Preferably, freshly exposed surfaces 240b, 254b, 248b, and 230b are formed by planarization of materials from layers 240, 254, 248 and 230 respectively. Sacrificial layer 230 is preferably an etch stop whose polishing rate is less than that of the other materials and which hence experiences only a slight change in height.

Figure 4M:
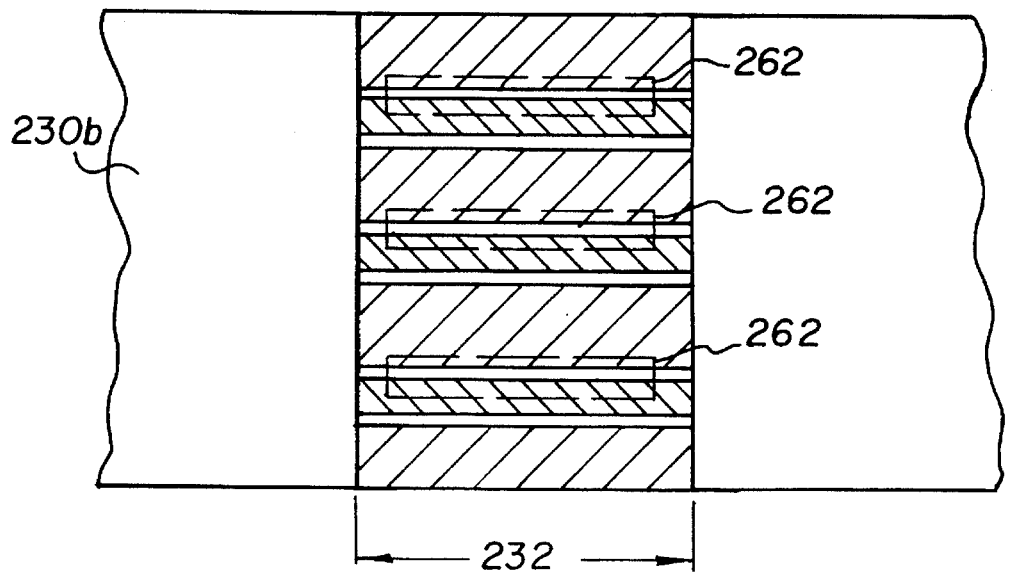
Figure 4N:
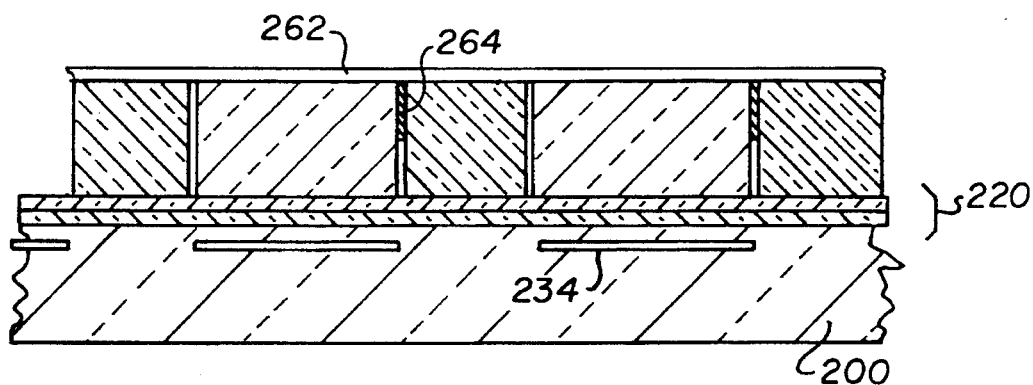

It remains, in a manner similar to that discussed in association with FIG. 2H to 2K, to electrically connect alternate conductive strips, preferable accomplished as previously described by partially etching the insulative region between alternate pairs of strips in regions 262 in FIG. 4M to a depth preferably about half the electrode thickness of the coplanar conductive strips, while protecting from the etch, the other set of alternate regions of insulative material 248 between regions 262 as well as sacrificial insulative layer 230. Because electrical connection can be accomplished by etching only a portion of the insulative region between two conductive strips, the etched region need not extend fully to sacrificial layer 230. For this purpose, the mask pattern openings of conventional photoresist coincide with regions 262 as shown in FIG. 4M.

As in the discussion of the previous embodiment, a layer of conductive interconnect material 262, preferably doped polysilicon, may now be deposited conformally over the device and converted to an insulator by thermal oxidation, except in isolated locations 264, where it remains conductive, as shown in FIG. 4N. Alternatively, planarization preferably using chemical mechanical polishing, can be used to remove conductive interconnect material 262 except in isolated locations 264, as discussed also in the previous embodiment.

For some applications, for example in making interline CCDs, it may be desirable to remove by etching at least portions of sacrificial layer 230 in order to accomplish implantation of impurity ions in the etched regions, self aligned to portions of the first or second conductive electrode strips, or to fabricate additional device structures in between the CCD shift registers. This can be accomplished by conventional photolithography followed by wet or dry selective etching.

At this point the device is substantially complete, save for conventional passivation, contact openings, and conductive metal electrode deposition and patterning steps, which are unrelated and not specific to the scope of this invention, but which need be performed to complete the device in the same manner as in the completion of any two phase CCD. It is to be appreciated that while a preferred embodiment has been described, there are many variants of the method of this invention applicable to a variety of device materials which may be employed within the scope of this invention to optimize device functionality in specific applications.

A related material choice for the dielectric layer 220 is a three layer stack of oxide, nitride, and oxide. Preferred in this embodiment are layer thicknesses for each of the three layers of from 50 to 300 Angstroms, the bottom layer having been thermally grown, the middle and top layers having been deposited by standard techniques of chemical vapor deposition. In the preferred embodiment using this choice of materials, the material preferred for the sacrificial layer 230 is nitride, deposited for example by chemical vapor deposition, to enable sacrificial layer 230 to be etched without etching the top layer of the dielectric layer 220. It is to be appreciated that the material comprising sacrificial layer 230 must be chosen to be etchable in a highly anisotropic etch to form vertical sidewalls without the etch penetrating dielectric layer 220, must be sufficiently thick to block subsequent ion implants, and must be removable without destruction of dielectric layer 220 or first and second conductive strips 240a and 254a. Related materials also satisfying these criteria are tin oxide and indium tin oxide.

Another preferred choice for the dielectric layer 220 is thermally grown oxide, preferably in the thickness range 100 to 1000 Angstroms. In the preferred embodiment using this choice of materials, the material preferred for the sacrificial layer 230 is nitride or indium tin oxide.

It is also to be appreciated that this invention is applicable to a variety of device structures in which one or more implants are desired formed below and self-aligned to a conductive electrode without the necessity of implantation through the electrode or any part of the electrode. The invention may be advantageously applied to other CCD structures, including CCDs of more than two phases, in cases where the ability to self-align implants with small lateral spread to gate electrode structures is of benefit. Also, more than one level of self-aligned implantation in a single CCD phase, while not required for charge transfer direction biasing, is useful in establishing built-in electric fields that increase the rate of charge transfer, and hence increase charge transfer efficiency for low levels of charge, as taught by Erhardt in U.S. Pat. No. 4,910,569. This may also be achieved by repeating one or more times the implantation step of FIG. 2C but with photoresist limiting the implant region for one or more implants, as is well known in the art.

Also, unique two phase CCD structures made possible by the present invention include structures in which the independent electrical control of a small number of storage and transfer regions is rendered possible by omission of the connection between adjacent conductive electrode strips that would, in accordance with this invention, ordinarily form a single phase, and by then clocking each of the conductive strips independently.

Another advantageous application, relating to the type of charge transfer direction biasing implants used in accordance with this invention, is achieved by choosing the charge transfer direction biasing implant to be of the first conductivity type. In this case, the charge transfer direction biasing implant acts as a CCD transfer region rather than as a storage region, and is advantageously chosen to be shorter than the remaining portion of the electrode phase. It is thus a feature of this technology that implantation in either storage or transfer regions is equally accommodated. It is to be appreciated that the possibility of all such combinations derives from the fact that in accordance with this invention the connection of adjacent electrodes requires minimal space in comparison with devices previously taught, for example by Amelio et al. in U.S. Pat. No. 3,911,560.

The invention has been described in detail with particular reference to preferred embodiments thereof, but it will be understood that variations and modifications can be effected within the spirit and scope of the invention.

PARTS LIST 10 semiconductive substrate
14 first insulative layer
16 second insulative layer
20 bilayer dielectric
30 first conductive layer
30a a first conductive strips
31 surface
32 implant
40 second conductive layer
40a a second conductive strips
41 surface
48 insulative region
49 surfaces
54 regions
55 alternate regions
56 photoresist
58 planar composite electrodes
59 gap regions
60 conductive interconnect material
60b regions
62 oxide layer
64 nitride layer
66 oxide layer
68 nitride layer
120 dielectric layer
200 semiconductive substrate
220 dielectric layer
230 sacrificial layer
230b exposed surface
232 trench
234 impurities 240 first conductive layer
240a first conductive strips
240b exposed surface
246 vertical walls
248 insulative region
248b exposed surface
254 second conductive layer
254a alternate conductive strips
254b exposed surface
262 regions
264 isolated locations
301 semiconductive substrate
305 gate electrode
306 gate electrode
307 gate electrode
309 region

What is claimed is:

1. In a CCD, a method of connecting electrically a first and second set of spaced conductive strips separated by vertical regions of an insulating material, resulting in a planar structure, the method comprising:
   (a) planarizing a set of interleaved first and second conductive strips separated by an insulative material to expose the surfaces of the set of interleaved first and second conductive strips and the surface of the insulative material;
   (b) etching the insulative material in regions separating alternate pairs of conductive strips, the etched regions contiguous with portions of the sides of the first and second conductive strips;
   (c) filling said etched regions with a conductive interconnect material; and
   (d) removing portions of the conductive interconnect material so that the conductive interconnect material is removed from regions over the set of interleaved first and second conductive strips.

2. The method of claim 1 in which the closely spaced strips are polysilicon.

3. The method of claim 1 in which the closely spaced conductive strips are planarized by chemical mechanical polishing.

4. The method of claim 1 in which the deposited conductive interconnect material is polycrystalline silicon.

5. The method of claim 1 in which the deposited conductive interconnect material is tungsten or tungsten silicide.

6. The method of claim 1 in which the step of removing portions of the conductive interconnect material is accomplished by thermal oxidation of the deposited conductive interconnect material at least to a depth equal to the thickness of the conductive interconnect material over the set of interleaved first and second conductive strips.

7. The method of claim 1 further including patterning by conventional photolithography the conductive interconnect material over the surfaces of the set of interleaved first and second conductive strips.

8. The method of claim 1 further including deposition and patterning of a separate insulative material prior to deposition and patterning by conventional photolithography of the conductive interconnect material on the set of interleaved first and second conductive strips.

9. A method of fabricating, at a region of first conductivity type in a semiconductor substrate, a planar, two phase charge coupled device with charge transfer direction biasing implants, the geometry of each charge transfer direction biasing implants being defined by a single mask level, the charge transfer direction biasing implant underlying and self-aligned to electrically connected first and second conductive strips, the steps comprising:
   (a) forming an insulative layer uniformly overlying a first conductivity type semiconductive substrate;
   (b) implanting in the semiconductive substrate second conductivity type impurity ions;
   (c) patterning, a first conductive layer on said insulative layer to form spaced first conductive strips;
   (d) implanting second conductivity type impurity ions into the semiconductive substrate the implant blocked in regions covered by the first conductive strips;
   (e) oxidizing the exposed first conductive strips to establish an insulating layer surrounding the first conductive strips;
   (f) uniformly depositing a second conductive layer;
   (g) planarizing said second conductive layer thereby removing the second conductive layer from regions in which the second conductive layer overlaps the first conductive strips at least to the extent that the second conductive layer is patterned into electrically isolated second conductive strips;
   (h) etching grooves between alternate pairs of first and second conductive strips, the grooves contiguous with portions of the first and second conductive strips; and
   (i) filling said grooves with a conductive interconnect material to form first and second planar composite electrodes.

10. The method of claim 9 in which the means of planarization is chemical mechanical polishing.

* * * * *